United States Patent
Kim et al.

(10) Patent No.: US 7,906,371 B2
(45) Date of Patent: Mar. 15, 2011

(54) SEMICONDUCTOR DEVICE AND METHOD OF FORMING HOLES IN SUBSTRATE TO INTERCONNECT TOP SHIELD AND GROUND SHIELD

(75) Inventors: OhHan Kim, Kyunggi-Do (KR); SunMi Kim, KyungKi-Do (KR); KyungHoon Lee, Kyounggi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 209 days.

(21) Appl. No.: 12/128,116

(22) Filed: May 28, 2008

(65) Prior Publication Data
US 2009/0294928 A1    Dec. 3, 2009

(51) Int. Cl.
*H01L 29/72* (2006.01)
(52) U.S. Cl. ......... 438/113; 438/106; 438/110; 438/112; 438/126
(58) Field of Classification Search .............. 438/106, 438/110, 112, 113, 126
See application file for complete search history.

(56) References Cited

U.S. PATENT DOCUMENTS

| | | | |
|---|---|---|---|
| 5,694,300 A | 12/1997 | Mattei et al. | |
| 7,187,060 B2 | 3/2007 | Usui | |
| 2006/0113642 A1* | 6/2006 | Kajiki et al. | 257/659 |
| 2006/0145361 A1 | 7/2006 | Yang et al. | |
| 2007/0030661 A1 | 2/2007 | Morris et al. | |
| 2007/0145539 A1 | 6/2007 | Lam | |

\* cited by examiner

*Primary Examiner* — Edward Wojciechowicz
(74) *Attorney, Agent, or Firm* — Robert D. Atkins; Patent Law Group

(57) ABSTRACT

A shielded semiconductor device is made by embedding a ground shield between layers of a substrate. Semiconductor die are mounted to the substrate over the ground shields. An encapsulant is formed over the semiconductor die and substrate. The encapsulant is diced to form dicing channels between the semiconductor die. A plurality of openings is drilled into the substrate along the dicing channels down through the ground shield on each side of the semiconductor die. A top shield is formed over the semiconductor die. The openings in the substrate are filled with a shielding material to electrically and mechanically connect the top shield to the ground shield. The substrate is singulated to separate the semiconductor die with top shield and ground shield into individual semiconductor devices. IPDs in the semiconductor die generate electromagnetic interference which is blocked by the respective top shield and ground shield.

24 Claims, 5 Drawing Sheets

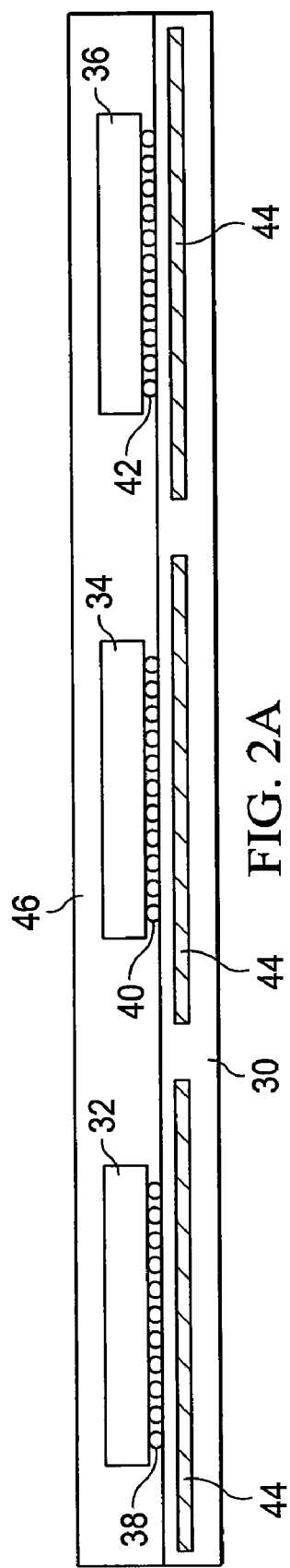
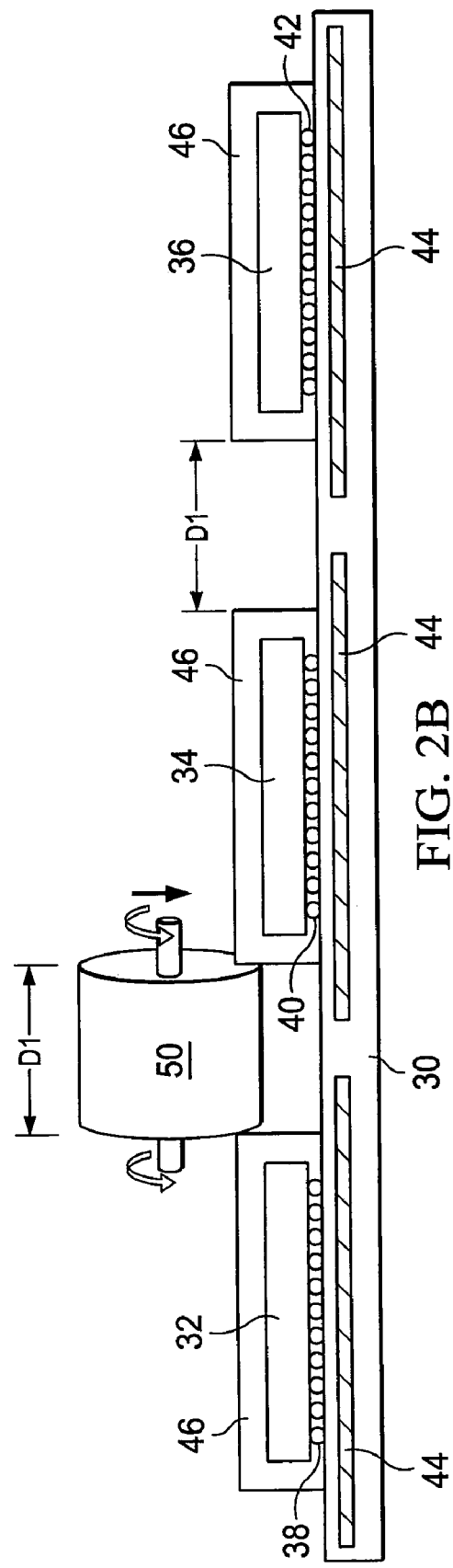

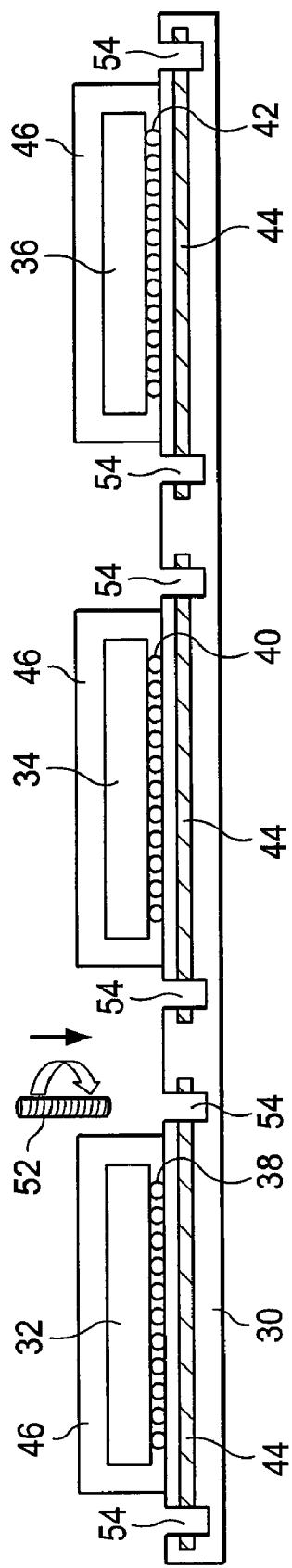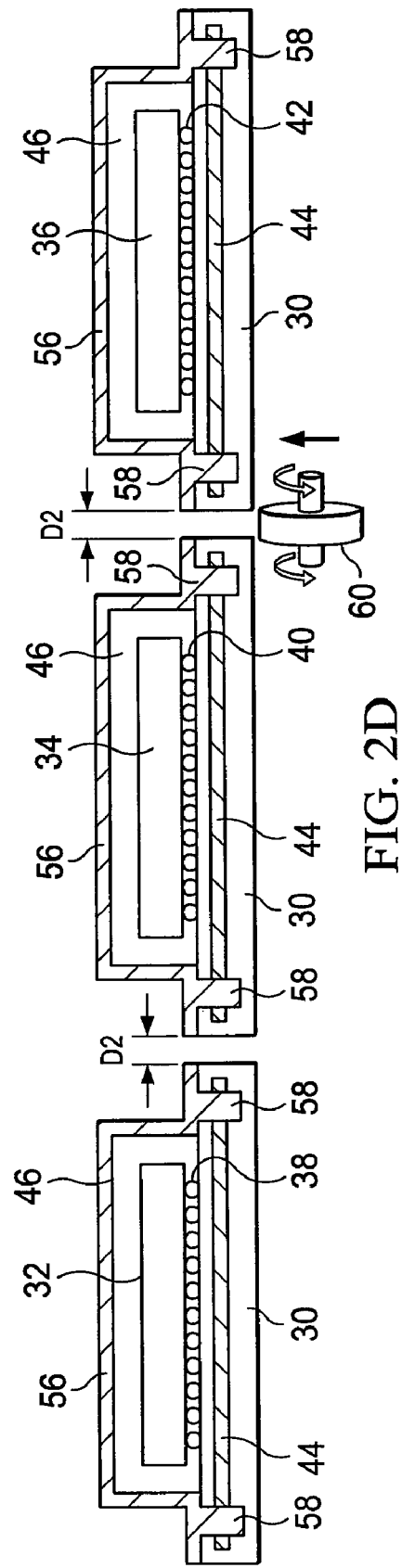

SEMICONDUCTOR DEVICE AND METHOD OF FORMING HOLES IN SUBSTRATE TO INTERCONNECT TOP SHIELD AND GROUND SHIELD

FIELD OF THE INVENTION

The present invention relates in general to semiconductor devices and, more particularly, to a semiconductor device having holes formed in the substrate around the semiconductor die to interconnect a top shield with a ground shield disposed in the substrate.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate undesired electromagnetic interference (EMI) and radio frequency interference (RFI), or other inter-device interference, such as capacitive, inductive, or conductive coupling, also known as cross-talk, which can interfere with the operation of adjacent circuit elements.

Various attempts have been made to shield the semiconductor packages from undesirable EMI or RFI by using metal enclosures. However, the metal enclosures often require complex and difficult-to-manufacture redistribution layers and metal vias between the top metal shield and bottom of the substrate that can increase the thickness of the package.

SUMMARY OF THE INVENTION

A need exists for a shielded semiconductor package with a simple interconnect between a top shield and ground shield contained within the substrate. Accordingly, in one embodiment, the present invention is a method of making a shielded semiconductor device comprising the steps of providing a multi-layer substrate, disposing a ground shield between layers of the substrate, mounting a plurality of semiconductor die to the substrate over the ground shield, forming an encapsulant over the semiconductor die and substrate, dicing the encapsulant to form dicing channels between the semiconductor die, forming a plurality of openings in the substrate along the dicing channels through the ground shield which extends into the dicing channels, forming a top shield over the semiconductor die, and filling the openings in the substrate with shielding material to electrically and mechanically connect the top shield to the ground shield.

In another embodiment, the present invention is a method of making a shielded semiconductor device comprising the steps of providing a substrate, embedding a ground shield within the substrate, mounting a plurality of semiconductor die to the substrate over the ground shield, forming an encapsulant over the semiconductor die and substrate, forming dicing channels between the semiconductor die, forming a plurality of openings in the substrate along the dicing channels through the ground shield which extends into the dicing channels, forming a top shield over the semiconductor die, and filling the openings in the substrate with conductive material to electrically and mechanically connect the top shield to the ground shield.

In another embodiment, the present invention is a method of making a shielded semiconductor device comprising the steps of providing a substrate, embedding a ground shield within the substrate, mounting a plurality of semiconductor die to the substrate over the ground shield, forming a plurality of openings in the substrate through the ground shield, forming a top shield over the semiconductor die, and filling the openings in the substrate with conductive material to electrically and mechanically connect the top shield to the ground shield.

In another embodiment, the present invention is a semiconductor device comprising a substrate and a ground shield embedded within the substrate. A semiconductor die is mounted to the substrate over the ground shield. A plurality of openings is formed in the substrate through the ground shield. A top shield is formed over the semiconductor die. A conductive material fills the openings in the substrate to electrically and mechanically connect the top shield to the ground shield.

BRIEF DESCRIPTION OF THE DRAWINGS

FIGS. 2A-2D illustrate a process of forming a semiconductor device with a ground shield within the substrate, top shield over the die, and interconnecting metal-filled holes;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited over the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
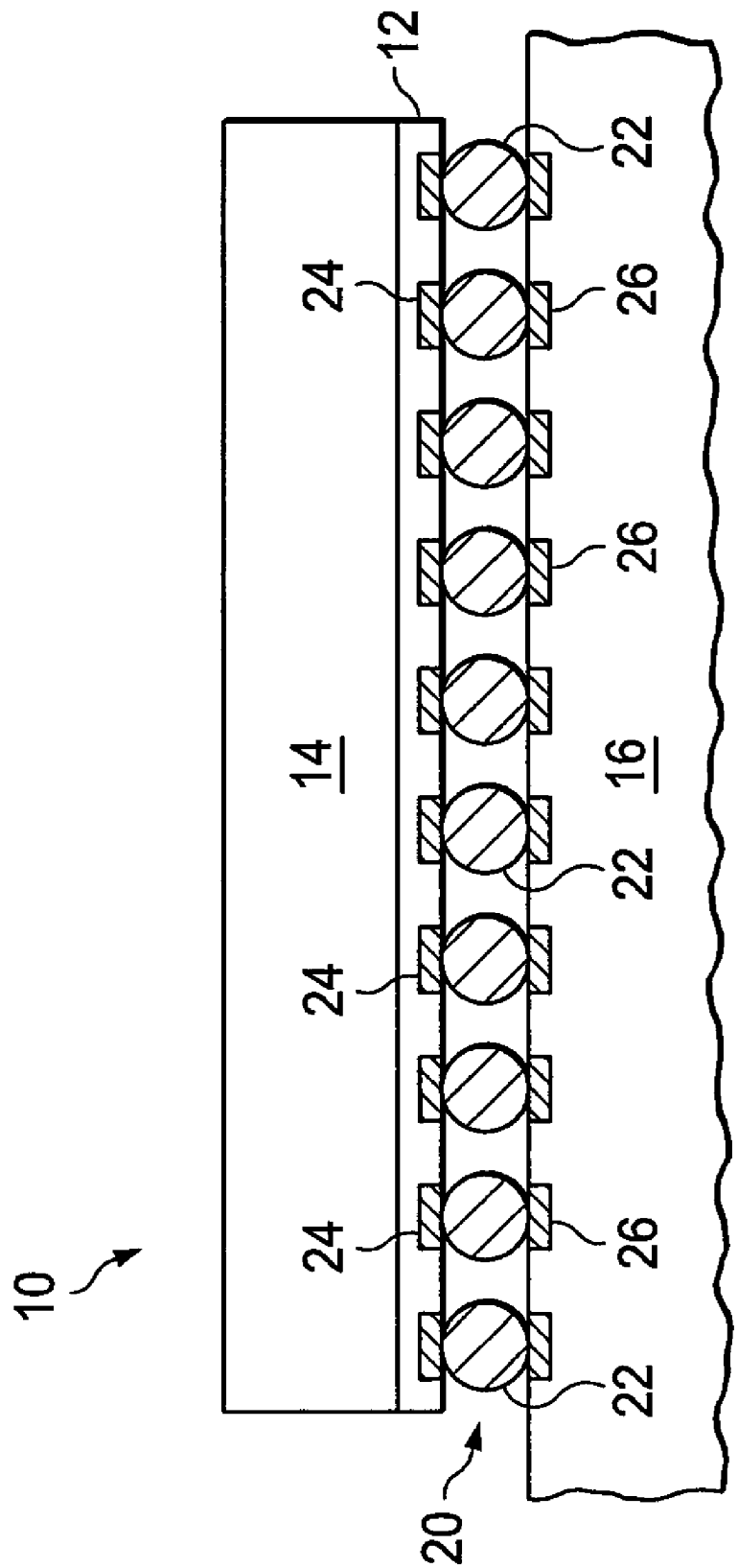
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and integrated passive devices (IPDs), conductive layers, and dielectric layers according to the electrical design of the die. Analog circuits may be created by the combination of one or more IPDs formed within active area 12. For example, an analog circuit may include one or more inductors, capacitors, and resistors formed within active area 12. The electrical and mechanical interconnect is achieved through a solder bump structure 20 comprising a large number of individual conductive solder bumps or balls 22. The solder bumps are formed on bump pads or interconnect sites 24, which are disposed over active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

FIGS. 2A-2D illustrate a process of enclosing a semiconductor die with electromagnetic interference (EMI) or radio frequency interference (RFI) shielding. In FIG. 2A, a multi-layer laminate substrate 30 provides structural support and electrical interconnect for semiconductor die 32, 34, and 36. Substrate 30 can have multiple layers of silicon, silicon carbide, polymer, polymer composite, metal, ceramic, glass, glass epoxy, beryllium oxide, or other rigid material. Solder bumps 38 bond to contact pads on substrate 30 to electrically connect semiconductor die 32 to conduction tracks on the substrate. Solder bumps 40 bond to contact pads on substrate 30 to electrically connect semiconductor die 34 to conduction tracks on the substrate. Solder bumps 42 bond to contact pads on substrate 30 to electrically connect semiconductor die 36 to conduction tracks on the substrate.

A metal ground shielding layer 44 is disposed between or embedded within layers of substrate 30. Ground shielding layer 44 extends from under the semiconductor die into the dicing channel between the semiconductor die, as described below. Ground shielding layer 44 is made with copper, aluminum, stainless steel, nickel silver, low-carbon steel, silicon-iron steel, and other metals and composites capable of blocking EMI, RFI, or other inter-device interference. Shielding layer 44 is electrically connected to an external low impedance ground point. Semiconductor die 32-36 are mounted to substrate 30 over ground shielding layer 44.

A molding compound or encapsulant 46 is deposited over substrate 30 and semiconductor die 32-36. Molding compound 46 can be made with epoxy acrylate or other polymer material and applied by transfer molding, liquid encapsulant molding, or other molding process. Molding compound 46 is non-conductive and environmentally protects the semiconductor device from external elements and contaminants.

In FIG. 2B, a cutting blade 50 removes encapsulant 46 between semiconductor die 32, 34, and 36 in a partial dicing step. The cutting blade 50 cuts a dicing channel of width D1, down to substrate 30. The partial dicing step cuts into encapsulant 46 to provide a drilling area on substrate 30. Semiconductor die 32-36 remain enclosed by encapsulant 46. In FIG. 2C, a drill 52 forms openings or holes 54 partially into, but not completely through, substrate 30. The holes 54 extend at least through ground shielding layer 44. Ground shielding layer 44 extends from under the semiconductor die into the dicing channel so that the drilling cuts through the ground shielding layer. One or more holes 54 are formed on each side of semiconductor die 32-36.

In FIG. 2D, a top or overlying shielding layer 56 is formed over all sides of encapsulant 46 using electrolytic plating, electroless plating, or other suitable metal deposition process. Shielding layer 56 is made with copper, aluminum, stainless steel, nickel silver, low-carbon steel, silicon-iron steel, and other metals and composites capable of blocking EMI, RFI, or other inter-device interference. Shielding layer 56 is mechanically and electrically connected to shielding layer 44 by depositing the same shielding material used for shielding layer 56 into holes 54. In one embodiment, holes 54 are filled with the same material as shielding layer 56 or other electrically conductive material. Accordingly, the combination of shielding layer 44, shielding layer 56, and metal-filled holes 58 substantially encloses semiconductor die 32-36 with EMI or RFI shielding material. Metal-filled holes 58 are disposed substantially outside the footprint of shielding layer 56 and extend through substrate 30 with sufficient depth to electrically connect with ground shielding layer 44. A cutting blade 60 singulates the semiconductor die 32, 34, and 36 into individual shielded semiconductor devices.

Figure 3:
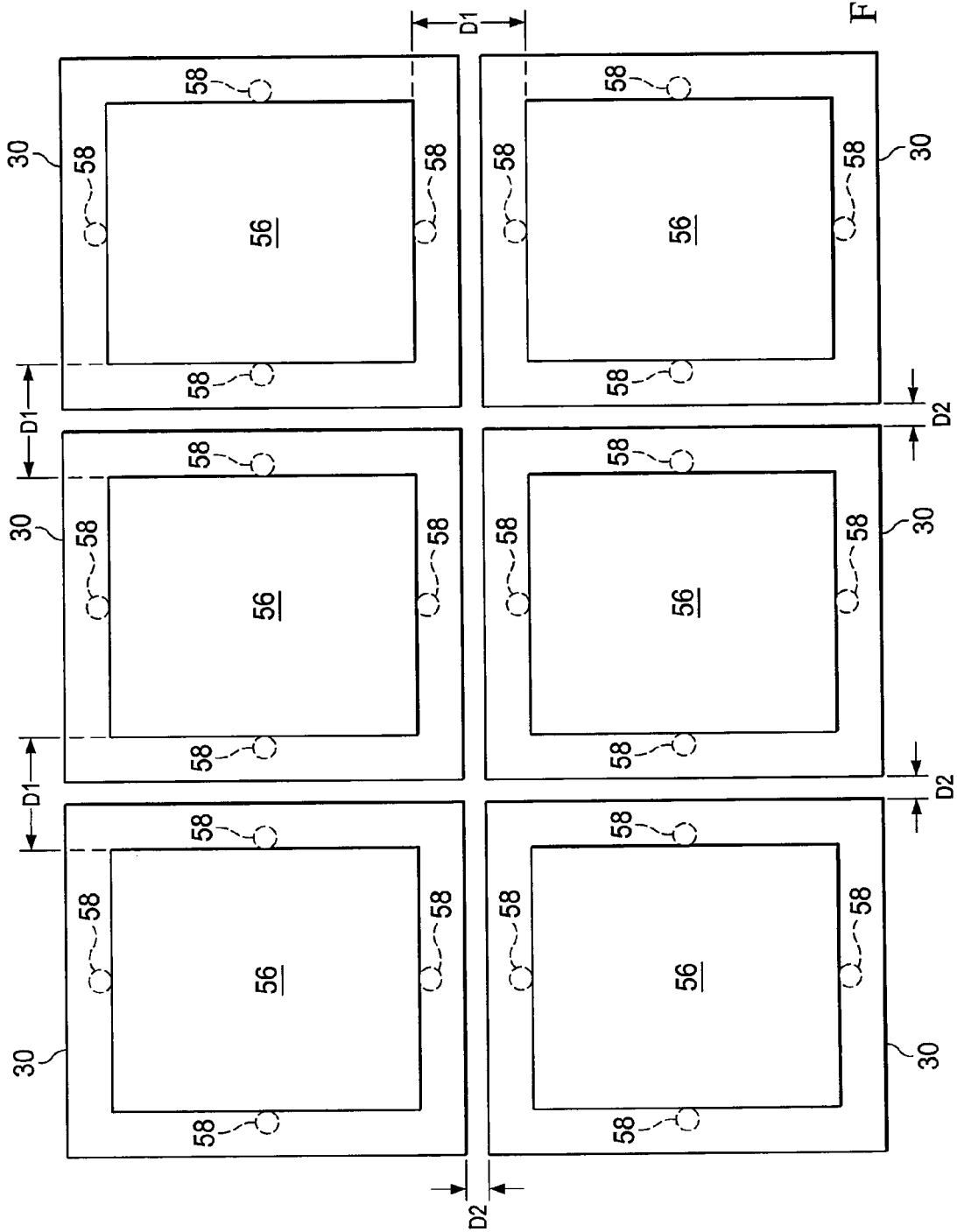
FIG. 3 illustrates a top view of the substrate with top shields enclosing the underlying semiconductor die which are connected to ground shields in the substrate with metal-filled holes through the substrate.

FIG. 3 illustrates a top view of substrate 30 with shielding layers 56 enclosing the underlying semiconductor die. The dicing step removes encapsulant 46 to provide a dicing channel of width D1. Metal-filled holes 58 are formed in the dicing channel to connect top shielding layer 56 to ground shielding layer 44. The singulation D2 separates the top and ground shielding layers and underlying semiconductor die into individual shielded semiconductor devices.

Figure 4:
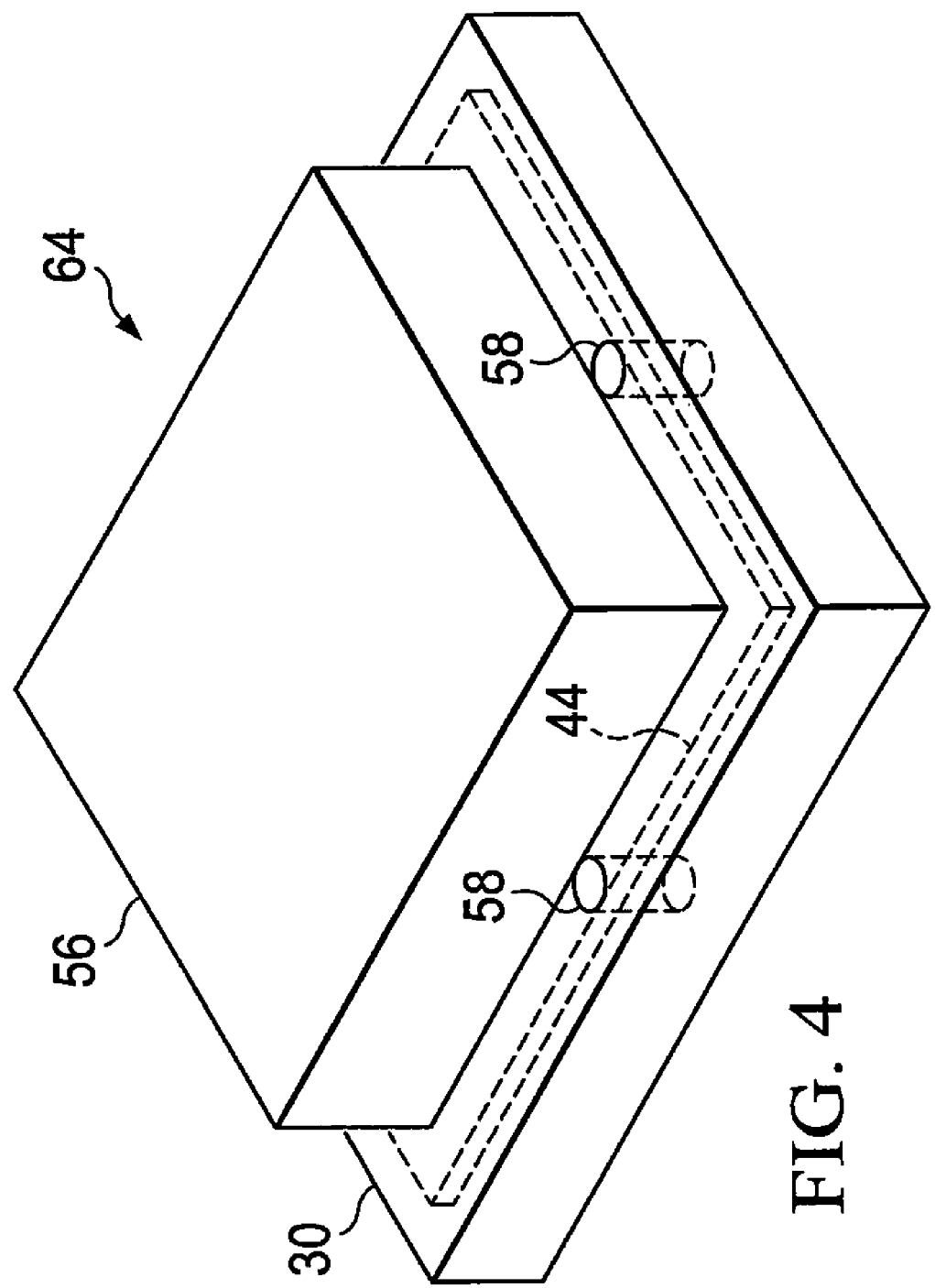
FIG. 4 illustrates the shielded semiconductor package with top shield and metal-filled holes connecting to ground shield.

A shielded semiconductor package or module 64 is shown in FIG. 4 with one or more semiconductor die substantially enclosed by top shielding layer 56, ground shielding layer 44, and metal-filled holes 58 disposed outside the footprint of the top shield and interconnecting the top and ground shielding layers.

The IPDs contained within semiconductor die 32-36 provide the electrical characteristics needed for high frequency applications, such as high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device.

The IPDs in semiconductor die 32-36 generate EMI or RFI, or are susceptible to EMI or RFI generated by other devices. For example, the output signal in the transmitter section of the radio frequency integrated circuit (RFIC) may interfere with the local oscillator (LO). The inductor can be used in the tank resonators of the LO in the RF transceiver. The LO includes a voltage-controlled oscillator (VCO) that is synchronized to an external crystal reference through a phase-locked loop (PLL). The VCO can be implemented as a cross-coupled amplifier circuit with a tuned resonant inductor-capacitor (LC) load. The inductor is made with one or two spiral inductor coils on the RFIC. External signals can couple into the VCO by magnetic induction directly into the tank resonator. If the external source is a periodic or quasi-periodic signal, it will introduce a spurious tone. In subsequent mixing, the RF signal is multiplied by the LO signal to transpose the band of interest down to low frequency for further signal processing. The presence of the spurious tone in the LO often causes out-of-band signals to be mixed into the base-band frequency range, which degrades the receiver sensitivity, adding both noise and cross-talk to the received signal. Therefore, each of these passive circuit elements has the potential to interfere with adjacent devices. The top shielding layer and ground shielding layer, interconnected by the metal-filled holes, block the EMI or RFI generated by the IPDs on the semiconductor die. Alternatively, the top shielding layer and ground shielding layer, interconnected by the metal-filled holes, inhibit EMI or RFI generated by external sources from reaching the EMI/RFI-susceptible IPDs. The novel top shielding layer and ground shielding layer interconnected by metal-filled holes along a dicing channel between the semiconductor die allows for thinner packages.

In summary, the semiconductor devices are enclosed by shielding material using a simple manufacturing process. A ground shielding layer is embedded between layers of the substrate. Semiconductor die are mounted to the substrate over the ground shielding layers. A top shielding layer is disposed over the semiconductor die. A hole is drilled partially into the substrate along a dicing channel between the semiconductor die, at least through the ground shielding layer embedded in the substrate. The hole is filled with metal shielding material to electrically and structurally connect the top shielding layer and ground shielding layer. The shielding layers isolate each circuit element from cross-talk generated by the adjacent circuit element. The cross-talk may be in the form of conductive coupling, inductive coupling, magnetic field coupling, electric field coupling, or capacitive coupling depending on the electrical nature of the adjacent device.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a shielded semiconductor device, comprising:
    providing a multi-layer substrate;
    disposing a ground shield between layers of the substrate, the ground shield being electrically connected to a ground point;
    mounting a plurality of semiconductor die to the substrate over the ground shield, the ground shield extending beyond a footprint of the plurality of semiconductors die;
    forming an encapsulant over the semiconductor die and substrate;
    dicing the encapsulant to form dicing channels between the semiconductor die;
    forming a plurality of openings in the substrate along the dicing channels through the ground shield which extends under dicing channels;
    forming a top shield over the semiconductor die;
    filling the openings in the substrate with shielding material to electrically and mechanically connect the top shield to the ground shield.

2. The method of claim 1, wherein the top shield and ground shield are each made with shielding material selected from the group consisting of copper, aluminum, stainless steel, nickel silver, low-carbon steel, and silicon-iron steel.

3. The method of claim 1, wherein the step of forming openings in the substrate includes drilling holes in the substrate along the dicing channels through the ground shield.

4. The method of claim 1, wherein the openings in the substrate are formed on each side of the semiconductor die.

5. The method of claim 1, further including singulating the substrate to separate the semiconductor die with the top shield and ground shield into individual semiconductor devices.

6. The method of claim 1, further including disposing an integrated passive device in the semiconductor die, the integrated passive device generating electromagnetic interference which is blocked by the respective top shield and ground shield.

7. The method of claim 6, wherein the respective top shield and ground shield inhibit electromagnetic interference from reaching the integrated passive device in the semiconductor die.

8. A method of making a shielded semiconductor device, comprising:
    providing a substrate;
    embedding a ground shield within the substrate;
    mounting a semiconductor die to the substrate over the ground shield, the ground shield extending beyond a footprint of the semiconductor die;

forming an encapsulant over the semiconductor die and substrate;

forming dicing channels around the semiconductor die;

forming a plurality of openings in the substrate along the dicing channels through the ground shield which extends under the dicing channels;

forming a top shield over the semiconductor die; and filling the openings in the substrate with conductive material to electrically and mechanically connect the top shield to the ground shield.

9. The method of claim 8, wherein the substrate is a multi-layer substrate and the ground shield is disposed between layers of the substrate.

10. The method of claim 8, wherein the step of forming openings in the substrate includes drilling holes in the substrate along the dicing channels through the ground shield.

11. The method of claim 8, wherein the openings in the substrate are formed on each side of the semiconductor die.

12. The method of claim 8, wherein the top shield and ground shield are each made with a shielding material selected from the group consisting of copper, aluminum, stainless steel, nickel silver, low-carbon steel, and silicon-iron steel.

13. The method of claim 8, further including disposing an integrated passive device in the semiconductor die, the integrated passive device generating electromagnetic interference which is blocked by the top shield and ground shield.

14. A method of making a shielded semiconductor device, comprising:

providing a substrate;

embedding a ground shield within the substrate;

mounting a semiconductor die to the substrate over the ground shield;

forming a plurality of openings in the substrate through the ground shield;

forming a top shield over the semiconductor die; and filling the openings in the substrate with conductive material to electrically and mechanically connect the top shield to the ground shield.

15. The method of claim 14, wherein the substrate is a multi-layer substrate and the ground shield is disposed between layers of the substrate.

16. The method of claim 14, further including:

forming an encapsulant over the semiconductor die and substrate; and forming dicing channels around the semiconductor die.

17. The method of claim 14, wherein the step of forming openings in the substrate includes drilling holes in the substrate through the ground shield.

18. The method of claim 14, wherein the openings in the substrate are formed on each side of the semiconductor die.

19. The method of claim 14, further including disposing an integrated passive device in the semiconductor die, the integrated passive device generating electromagnetic interference which is blocked by the top shield and ground shield.

20. A method of making a shielded semiconductor device, comprising:

providing a substrate;

embedding a ground shield within the substrate;

mounting a semiconductor die to the substrate over the ground shield;

forming an encapsulated over the semiconductor die and substrate;

forming dicing channels around the semiconductor die;

forming a plurality of openings in the substrate along the dicing channels through the ground shield;

forming a top shield over the semiconductor die; and filling the openings in the substrate with conductive material to electrically and mechanically connect the top shield to the ground shield.

21. The method of claim 20, wherein the substrate is a multi-layer substrate and the ground shield is disposed between layers of the substrate.

22. The method of claim 20, wherein the steps of forming openings in the substrate includes drilling holes in the substrate along the dicing channels through the grounds shield.

23. The method of claim 20, wherein the top shield and ground shield are each made with a shielding material selected from the group consisting of copper, aluminum, stainless steel, nickel silver, low-carbon steel, and silicon-iron steel.

24. The method of claim 20, further including disposing an integrated passive device in the semiconductor die, the integrated passive device generating electromagnetic interference which is blocked by the top shield and ground shield.

* * * * *